US011496133B1

(12) United States Patent
Suarez et al.

(10) Patent No.: US 11,496,133 B1
(45) Date of Patent: Nov. 8, 2022

(54) RADIATION HARDENED HOUSEKEEPING SLAVE NODE (RH-HKSN) APPLICATION SPECIFIC INTEGRATED CIRCUIT (ASIC) ELEMENT

(71) Applicant: United States of America as represented by the Administrator of NASA, Washington, DC (US)

(72) Inventors: George Suarez, Columbia, MD (US); Jeffrey J. DuMonthier, Ashburn, VA (US); Gerard T. Quilligan, Gulf Breeze, FL (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 17/388,555

(22) Filed: Jul. 29, 2021

(51) Int. Cl.
*H03K 19/003* (2006.01)

(52) U.S. Cl.
CPC .............................. *H03K 19/00338* (2013.01)

(58) Field of Classification Search
None
See application file for complete search history.

(56) References Cited

U.S. PATENT DOCUMENTS

| 5,617,090 A * | 4/1997 | Ma ........................ H03M 3/474 341/118 |
| 6,744,376 B1 * | 6/2004 | Pascalidis .............. G08C 15/00 340/870.11 |
| 10,649,949 B1 * | 5/2020 | Suarez .................... G06F 13/24 |
| 10,819,364 B1 * | 10/2020 | Suarez ................... H03H 7/463 |

* cited by examiner

*Primary Examiner* — Jany Richardson
(74) *Attorney, Agent, or Firm* — Christopher O. Edwards; Bryan A. Geurts; Helen M. Galus

(57) ABSTRACT

Embodiments may provide a radiation hardened low-power data acquisition system-on-chip (SOC) suitable for space flight. The various embodiments may provide the radiation hardened low-power data acquisition SOC having a radiation hardened semiconductor die, a radiation hardened multiplexer integrated on the radiation hardened semiconductor die and configured to receive a plurality of analog signals and selectively output an analog signal of the plurality of analog signals, at least one radiation hardened analog to digital converted integrated on the radiation hardened semiconductor die and configured to convert the analog signal to a digital signal, and a radiation hardened serial communication interface integrated on the radiation hardened semiconductor die and configured to output the digital signal. The various embodiments may provide a computing having a processor and the radiation hardened low-power data acquisition SOC electrically coupled to the processor such that the digital signal is output to the processor.

17 Claims, 3 Drawing Sheets

RADIATION HARDENED HOUSEKEEPING SLAVE NODE (RH-HKSN) APPLICATION SPECIFIC INTEGRATED CIRCUIT (ASIC) ELEMENT

ORIGIN OF THE INVENTION

The invention described herein was made by employees of the United States Government, and may be manufactured and used by or for the Government for governmental purposes without the payment of any royalties thereon or therefore.

FIELD OF THE INVENTION

The present invention relates to data collection for electronic systems, and more particularly to low power data collection using radiation hardened application specific integrated circuits (ASIC) suitable for use on spacecraft during space flight.

BACKGROUND OF THE INVENTION

Electronic systems used in spacecraft, such as space stations (e.g., the International Space Station (ISS), space vehicles, small satellites or nanosatellites (e.g., CubeSats), avionics (e.g., SpaceCube), etc., face challenges generally not encountered by earth based electronic systems, such as radiation exposure. Health monitoring of a spacecraft and its instruments is essential for mission success of the spacecraft. Typically, sensors are distributed across various sub-systems of the spacecraft and data is collected using discrete components such as analog-to-digital converters, analog multiplexers, amplifiers and memory. Programmable devices are used to implement data acquisition control and storage, and interfacing with higher level systems. Such a discrete implementation requires increased size, weight, power, interconnectivity complexity, and qualification of multiple parts versus a single integrated circuit solution. Available integrated circuits that can be incorporated into a spacecraft for monitoring of the spacecraft and its instruments are "soft" and not suitable for space applications, mainly due the lack of radiation tolerance

SUMMARY

The various embodiments may provide a radiation hardened low-power data acquisition system-on-chip (SOC) suitable for space flight. The various embodiments may provide the radiation hardened low-power data acquisition SOC having a radiation hardened semiconductor die, a radiation hardened multiplexer integrated on the radiation hardened semiconductor die and configured to receive a plurality of analog signals and selectively output an analog signal of the plurality of analog signals, at least one radiation hardened analog to digital converted (ADC) integrated on the radiation hardened semiconductor die and configured to convert the analog signal to a digital signal, and a radiation hardened serial communication interface integrated on the radiation hardened semiconductor die and configured to output the digital signal.

The various embodiments may provide a computing system, having a processor, and a radiation hardened low-power data acquisition SOC electrically coupled to the processor, electrically connectable to an instrument or a sub-system of a spacecraft, and having a radiation hardened semiconductor die, a radiation hardened multiplexer integrated on the radiation hardened semiconductor die and configured to receive a plurality of analog signals from the instrument or the sub-system of the spacecraft and selectively output an analog signal of the plurality of analog signals, at least one radiation hardened ADC integrated on the radiation hardened semiconductor die and configured to convert the analog signal to a digital signal, and a radiation hardened serial communication interface integrated on the radiation hardened semiconductor die and configured to output the digital signal to the processor.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION OF THE INVENTION

Figure 1:
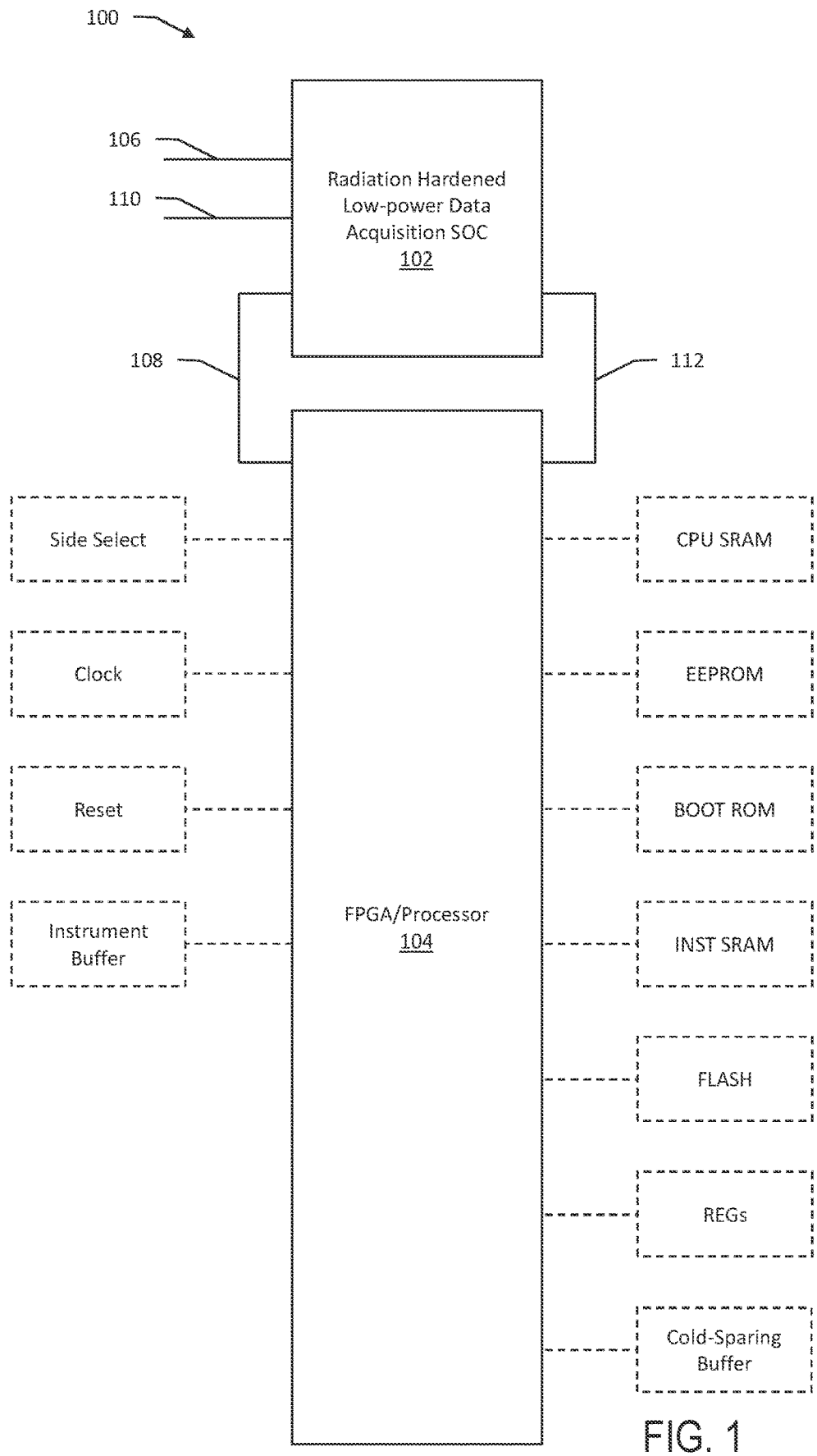
FIG. 1 is block diagram of a computing system incorporating radiation hardened low-power data acquisition system-on-chip (SOC) according to an embodiment.

For purposes of description herein, it is to be understood that the specific devices and processes illustrated in the attached drawings, and described in the following specification, are simply exemplary embodiments of the inventive concepts defined in the appended claims. Hence, specific dimensions and other physical characteristics relating to the embodiments disclosed herein are not to be considered as limiting, unless the claims expressly state otherwise.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Typically, housekeeping and/or telemetry devices are distributed across various sub-systems of the spacecraft and data is collected using discrete components such as analog-to-digital converters, analog multiplexers, amplifiers and memory. The housekeeping and/or telemetry hardware is decentralized, requiring redundant components and multitudes of connecting wires to monitor different sub-systems and communicate housekeeping and/or telemetry data. Currently available commercial off the shelf (COTS) low-power data acquisition system-on-a-chip (SOC) solutions are not acceptable for space flight because the COTS low-power data acquisition SOCs are susceptible to radiation induced upsets and/or failure and are limited in reliability.

The various embodiments may provide a radiation hardened low-power data acquisition SOC, consuming less than approximately 100 mW. The radiation hardened low-power data acquisition SOC may be implemented as a radiation hardened housekeeping slave node (RH-HKSN) application specific integrated circuit (ASIC). The radiation hardened low-power data acquisition SOC may be suitable for implementation for miniaturized instrument, small satellite or nanosatellite (e.g., CubeSats), and spacecraft housekeeping data collection. The radiation hardened low-power data acquisition SOC may be used as a remote terminal unit (RTU) that may operate as a standalone, centralized housekeeping and/or telemetry data collection node.

The various embodiments may provide the radiation hardened low-power data acquisition SOC configured to drive housekeeping and/or telemetry electronics and/or measure housekeeping and/or telemetry data. For example, the radiation hardened low-power data acquisition SOC may be configured to drive and/or measure platinum resistance thermistors, total ionizing dose using external RadFETs, pressure sensors, voltages, etc. The radiation hardened low-power data acquisition SOC may be configured to drive housekeeping and/or telemetry electronics and/or measure housekeeping and/or telemetry data for any number and combination of spacecraft sub-systems, such as particle instruments, laser altimeters, astrophysics X-ray energetic telescopes, power supplies, etc.

The radiation hardened low-power data acquisition SOC may reduce the instrument and spacecraft housekeeping electronics, for example, by more than 30% by combining analog, digital and mixed-signal functions on a single radiation hardened silicon die with serial interfaces to reduce the number of wires and system level complexity. For example, the radiation hardened low-power data acquisition SOC may include serial interfaces (e.g., I²C, SPI, and CAN) that may reduce wiring complexity and mass, particularly when distributing multiple housekeeping and/or telemetry devices across an instrument. For another example, the radiation hardened low-power data acquisition SOC implemented as an ASIC may eschew a microprocessor. Rather, the radiation hardened low-power data acquisition SOC may employ analog and mixed-signal blocks designed with higher performance and greatly reducing a package size compared to low-power data acquisition SOC incorporating a microprocessor. The reduced hardware requirements for implementing the radiation hardened low-power data acquisition SOC may result in reduced mass, volume, power consumption, and/or production cost. In turn, the radiation hardened low-power data acquisition SOC may enable and advance miniaturized instrument and spacecraft housekeeping electronics by replacing more massive, voluminous, power consuming, and/or costly housekeeping and/or telemetry devices.

FIG. 1 is a is block diagram of a computing system 100 incorporating radiation hardened low-power data acquisition system-on-chip (SOC) 102 according to an embodiment. With reference to FIG. 1, the computing system 100 may be a computing system 100 implemented as part of an instrument or sub-system of a small satellite or nanosatellite (e.g., CubeSats) and/or spacecraft (e.g., International Space Station, interplanetary rocket or shuttle, etc.). The computer system 100 may be configured for instrument or sub-system housekeeping, including to monitor and manage health of the instrument or sub-system electronics. In some embodiments, the computing system 100, and specifically the radiation hardened low-power data acquisition SOC 102, may be configured to drive housekeeping and/or telemetry electronics and/or measure housekeeping and/or telemetry data. For example, the radiation hardened low-power data acquisition SOC 102 may be configured to drive and/or measure platinum resistance thermistors, total ionizing dose using external RadFETs, pressure sensors, voltages, etc. The radiation hardened low-power data acquisition SOC 102 may be configured to drive housekeeping and/or telemetry electronics and/or measure housekeeping and/or telemetry data for any number and combination of spacecraft instruments or sub-systems, such as particle instruments, laser altimeters, astrophysics X-ray energetic telescopes, power supplies, etc. The radiation hardened low-power data acquisition SOC 102 may be implemented as an RH-HKSN ASIC. The radiation hardened low-power data acquisition SOC 102 may be used as a remote terminal unit (RTU) that may operate as a standalone, centralized housekeeping and/or telemetry data collection node In some embodiments, the radiation hardened low-power data acquisition SOC 102 may receive analog signals, such as voltages, from any number and combination of instruments or sub-systems. The analog signals may be housekeeping and/or telemetry data representative of a health status of the electronics of an associated instrument or sub-system. The radiation hardened low-power data acquisition SOC 102 may be electrically connectable to the instrument or sub-system via any number and combination of analog signal communication buses 106, via which the radiation hardened low-power data acquisition SOC 102 may receive the analog signals.

The radiation hardened low-power data acquisition SOC 102 may receive an analog to digital conversion control signal from a digital processor 104 of the computing system 100. The analog to digital conversion control signal may be configured to control an ability of the radiation hardened low-power data acquisition SOC 102 to function to convert the received analog signals to digital signals representative of the health status of the electronics of the associated instrument or sub-system. For example, the analog to digital conversion control signal may be configured to indicate to the radiation hardened low-power data acquisition SOC 102 which of the analog signals to convert to digital signals. For another example, the analog to digital conversion control signal may be configured to indicate to the radiation hardened low-power data acquisition SOC 102 to implement analog to digital conversion. The radiation hardened low-power data acquisition SOC 102 may be electrically connectable to the processor 104 via an analog to digital conversion control signal communication bus 108, via which the radiation hardened low-power data acquisition SOC 102 may receive the analog to digital conversion control signal.

In some embodiments, the radiation hardened low-power data acquisition SOC 102 may receive an amplifier signal, such as a voltage. The amplifier signal may be configured to cause an instrumentation amplifier to generate a combined signal from pseudo differential signals, as described further herein. In some embodiments, a ground sensing level shifter and the instrumentation amplifier may enable reading signals of a sub-system, which might not be at zero potential and have an offset, referenced to grounds from other sub-systems. The ground sensing level shifter and instrumentation amplifier may be optional before feeding the signal to one of the ADCs. The radiation hardened low-power data acquisition SOC 102 may be electrically connectable to a memory device, such as a register, via an amplifier signal communication bus 110, via which the radiation hardened low-power data acquisition SOC 102 may receive the amplifier signal.

The radiation hardened low-power data acquisition SOC 102 may output the digital signals generated by the radiation hardened low-power data acquisition SOC 102 by analog to digital conversion of the analog signals. For example, the radiation hardened low-power data acquisition SOC 102 may output the digital signals to the processor 104. For another example, the radiation hardened low-power data acquisition SOC 102 may output the digital signals to the processor 104 in response to receiving the analog to digital conversion control signal. The radiation hardened low-power data acquisition SOC 102 may be electrically connectable to the processor 104 via a digital signal communication bus 112, via which the radiation hardened low-power data acquisition SOC 102 may output the digital signals.

The radiation hardened low-power data acquisition SOC 102 may be configured to withstand radiation exposure of extended spaceflight. Radiation hardening of the radiation hardened low-power data acquisition SOC 102 may help prevent radiation induced upsets and/or failure and improve reliability in comparison to available soft integrated circuits, which may be configured to withstand absorption of, for example, between 1 and 20 krad. For example, the radiation hardened low-power data acquisition SOC 102 may be able to withstand absorption of at least approximately 300 krad. For another example, the radiation hardened low-power data acquisition SOC 102 may be able to withstand absorption of at least approximately 1 Mrad. For another example, the radiation hardened low-power data acquisition SOC 102 may be able to withstand absorption of at least approximately 3 Mrad.

The computing system 100 may include various other components configured to enable operation of the computing system 100 including the processor 104, such as field programmable gate array (FPGA), low-power microprocessors, etc. The processor 104 may be configured to transmit control signals to the radiation hardened low-power data acquisition SOC 102, such as the analog to digital conversion control signal via the analog to digital conversion control signal communication bus 108. The processor 104 may be configured to receive data signals from the radiation hardened low-power data acquisition SOC 102, such as digital signals via the digital signal communication bus 112.

Examples of further components of the computing system 100, any number and combination of which may be optionally included, are illustrated in FIG. 1, such as memory devices (e.g., "CPU SRAM", "EEPROM", "BOOT ROM", "INST SRAM", "FLASH", "Regs", etc.), clocks (e.g., "Clock"), resets (e.g., "Reset"), selects (e.g., "Side Select"), buffers (e.g., "Instrument Buffer", optional "Cold-Sparing Buffer"), etc. The illustration in FIG. 1 and the components thereof are used as an example for ease of explanation. The illustration in FIG. 1 and the accompanying descriptions do not limit the scope of the claims or the descriptions herein. One of ordinary skill in the art will recognize that any number and combination of the components may be combined, separated, rearranged, omitted, etc., and that additional components, such as additional ones of the foregoing components and/or other common components of a computing device, may be included in any configuration.

Figure 2:
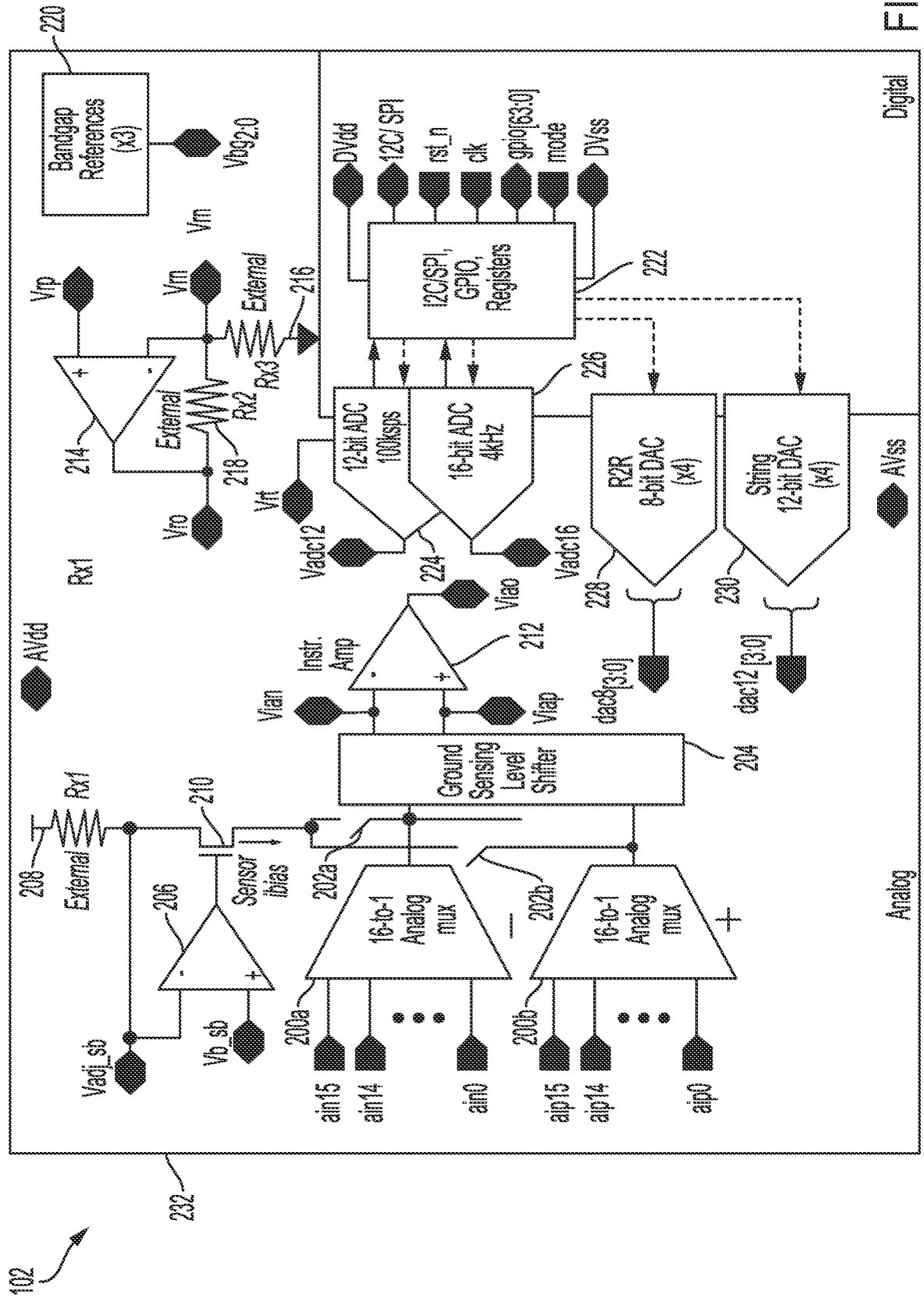
FIG. 2 is a block diagram of a radiation hardened low-power data acquisition SOC illustrated in FIG. 1 according to an embodiment.

FIG. 2 is a block diagram of the radiation hardened low-power data acquisition SOC 102 illustrated in FIG. 1 according to an embodiment. With reference to FIGS. 1 and 2, the radiation hardened low-power data acquisition SOC 102 may include various electronic hardware components integrated on and electrically coupled to the radiation hardened low-power data acquisition SOC 102. In some embodiments, the radiation hardened low-power data acquisition SOC 102 may eschew any software programmable components, such as a software programmable processor.

The low-power data acquisition SOC 102 may include various components for selecting analog signals, such as voltages, from any number and combination of instruments or sub-systems to convert to digital signals. The analog signals may be housekeeping and/or telemetry data representative of a health status of the electronics of an associated instrument or sub-system. In some embodiments, the radiation hardened low-power data acquisition SOC 102 may include one or more multiplexers 200a, 200b, such as two multiplexers. The multiplexers 200a, 200b may be configured to receive multiple analog signals from various instruments or sub-systems via inputs of the multiplexers 200a, 200b. For example, the multiplexers 200a, 200b may be configured, in combination, to receive analog signals via 32 multiplexer inputs (e.g., ain0-ain15, aip0-aip15), such as 16 multiplexer inputs per multiplexer 200a, 200b. For another example, each input of a multiplexer 200a, 200b may be electrically connectable to an instrument or a sub-system or to a component of an instrument or a sub-system. The multiplexers 200a, 200b may receive analog signals from an instrument or a sub-system at an input associated with the instrument or a sub-system. The multiplexers 200a, 200b may be electrically connectable to the instrument or sub-system via any number and combination of the analog signal communication buses 106 (in FIG. 1), via which the multiplexers 200a, 200b may receive the analog signals.

The multiplexers 200a, 200b may further include select inputs (e.g., +, −) configured to receive an analog to digital conversion control signal configured to indicate to the multiplexers 200a, 200b which of the analog signals to select for conversion to digital signals. The multiplexers 200a, 200b may receive the analog to digital conversion control signals via the analog to digital conversion control signal communication bus 108 (FIG. 1). The multiplexers 200a, 200b may interpret the analog to digital conversion control signals and select an analog signal from among the analog signals received at the multiplexer inputs to output via a multiplexer output.

The multiplexer output of each multiplexer 200a, 200b may be electrically coupled to a respective electric contactor 202a, 202b. The electric contactor 202a, 202b may be an electronically controllable contactor 202a, 202b, such as a switch, configured to electrically connect the respective multiplexer output to a bias current (e.g., sensor ibias), output from a bias current generating circuit. The electric contactor 202a, 202b may be controlled via the analog to digital conversion control signal based on which of the multiplexers 200a, 200b the analog to digital conversion control signal controls to output an analog signal.

The analog signal received and output by the multiplexers 200a, 200b may be a low voltage analog signal. For example, a low voltage analog signal may be approximately a ground level voltage. For another example, a low voltage analog signal may be between approximately −0.5 V and approximately 0.5 V. The low voltage analog signal may be smaller than components of the radiation hardened low-power data acquisition SOC 102 may differentiate from a ground signal. The bias current may increase the voltage of the analog signal to a level at which the components of the radiation hardened low-power data acquisition SOC 102 may differentiate from a ground signal.

The bias current may be provided by the bias current generating circuit having a bias amplifier 206, a resistor 208, and a transistor 210, which may be any sort of transistor, such as a field effect (FET) transistor. A voltage adjusting signal (e.g., Vadj_sb) may be applied to a first input of the bias amplifier 206, to a first node of the transistor (e.g., source node), and to an end of the resistor 208. A bias current generating circuit control voltage (e.g., Vb_sb) may be applied to a second input of the bias amplifier 206. An output of the bias amplifier 206 may be electrically coupled to a gate node of the transistor 210. In response to receiving the voltage adjusting signal and the bias current generating circuit control voltage, the bias amplifier 206 may output an amplified voltage configured to activate the transistor 210 to enable the transistor 210 to output the bias current, having at least part of the voltage adjusting signal, via a second node (e.g., drain node) selectively electrically coupled to the output of the multiplexer 200a, 200b via the electric contactor 202a, 202b. In some embodiments, the resistor 208a may be rated to consume a portion of the voltage adjusting signal beyond what is needed to provide a sufficient bias current to increase the voltage of the analog signal, generating a biased analog signal. In some embodiments the biased analog signal may be received by an analog to digital converter (ADC) 224, 226. The ground sensing level shifter 204 may receive the biased analog signal, implement a level shift, and output a shifted analog signal to an amplifier 212 (e.g., "Instr. Amp").

In some embodiments, radiation hardened low-power data acquisition SOC 102 may optionally include a ground sensing level shifter 204 and an instrumentation amplifier 212 (e.g., "Instr. Amp"). The ground sensing level shifter 204 may have a first input electrically coupled to the output of a first multiplexer 200a and a second input electrically coupled to the output of a second multiplexer 200b. The inputs of the ground sensing level shifter 204 may also be electrically coupled to a respective electric contactor 202a, 202b. The ground sensing level shifter 204 may have a first output associated with a first multiplexer 200a and electrically coupled to a first input of the instrumentation amplifier 212, and have a second output associated with a second multiplexer 200b and electrically coupled to a second input of the instrumentation amplifier 212. The ground sensing level shifter 204 may receive the biased analog signal, implement a level shift to generate a shifted analog signal, which may be configured as pseudo differential signal of the instruments or sub-systems, and output the shifted analog signal to an amplifier 212. Each of the inputs of the instrumentation amplifier 212 may be configured to receive a shifted analog signal output by ground sensing level shifter 204 and/or a voltage (e.g., Vain, Viap) for combining and generating a combined signal. The ground sensing level shifter 204 and the instrumentation amplifier 212 enable reading of the analog signals referenced to grounds from other sub-systems which might not be at zero potential and have an offset. Which input of the instrumentation amplifier 212 receives the shifted analog signal output and which receives the voltage for combining with the output of the ground sensing level shifter 204 may depend on which multiplexer 200a, 200b is selected to output an analog signal. For example, in response to a multiplexer 200a, 200b being selected to output an analog signal, the shifted analog signal for the multiplexer 200a, 200b may be output to the respective input of the instrumentation amplifier 212 and the other input of the instrumentation amplifier 212 may receive the voltage for combining with the output of the ground sensing level shifter 204. The instrumentation amplifier 212 may generate and output the combined analog signal (e.g., Viao). In some embodiments, the combined analog signal may be received by an ADC 224, 226.

The radiation hardened low-power data acquisition SOC 102 may further include an inverting operational amplifier 214. A first input of the inverting operational amplifier 214 may be electrically coupled to a first input voltage (e.g., Vrp). A second input of the input of the inverting operational amplifier 214 may be electrically coupled to a second input voltage (e.g., Vrn), to a grounded resistor 216, and a first end of a resistor 218. An output of the inverting operational amplifier 214 may be electrically coupled to a second end of the resistor 218 and may output an amplified voltage (e.g., Vro). In some embodiments, the rating of the grounded resistor 216 may be greater than the rating of the resistor 218, such as a ratio of 3:2. The radiation hardened low-power data acquisition SOC 102 may further include multiple bandgap reference 220, such as three bandgap references 220, each of which may provide a set voltage reference (e.g., $Vbg_{2:0}$).

The radiation hardened low-power data acquisition SOC 102 may further include a serial communication interface 222 configured to enable serial communication between the radiation hardened low-power data acquisition SOC 102 and other components of the computing device 100 (in FIG. 1), such as the processor 104 (in FIG. 1). The serial communication interface 222 may support any number and combination of serial communication protocols, such as $I^2C$, SPI, CAN, etc. The serial communication interface 222 may support GPIO connections and function. The serial communication interface 222 may include registers for supporting serial communication using the serial communication interface 222. The serial communication interface 222 may include various input and/or output leads, such as a power supply lead (e.g., DVdd), and a communication protocol lead (e.g., $I^2C$/SPI), a reset lead (e.g., rst_n), a clock lead (e.g., clk), multiple GPIO leads (e.g., $gpio_{[63:0]}$), a serial communication mode lead (e.g., mode), and/or a ground lead (e.g., DVss).

The serial communication interface 222 may be electrically coupled with various ADCs 224, 226 and digital to analog converters (DAC) 228, 230. The various ADCs 224, 226 may be differently configured, such as having different resolutions, sampling rates, etc. In some embodiments, the ADC 224 may have a lower resolution than the ADC 226. For example, the ADC 224 may have a 12-bit resolution and the ADC 226 may have a 16-bit resolution. In some embodiments, the ADC 224 may have a lower sampling rate than the ADC 226. For example, the ADC 224 may have a 100 kbps sampling rate and the ADC 226 may have a 4 kHz sampling rate. The ADCs 224, 226 may receive a reference voltage (e.g., Vrt) and analog signals, such as voltages, representative of the housekeeping and/or telemetry data and convert the analog signal to digital signals. The ADCs 224, 226 may receive analog signal and output digital signals of a number of bits of the resolution of the ADCs 224, 226. For example, the ADC 224 may receive analog voltages (e.g., Vadc12) and output a 12-bit digital signal, and the ADC 226 may receive analog voltages (e.g., Vadc16) and output a 16-bit digital signal. The ADCs 224, 226 may output digital signals converted from the received analog signals representative of the housekeeping and/or telemetry data to the serial communication interface 222, which may output the digital signals via the GPIO leads.

The various DACs 228, 230 may be differently configured, such as having different architectures, resolutions, etc. In some embodiments, the DAC 228 and the DAC 230 may have different architectures. For example, the DAC 228 may have an R2R DAC architecture and the DAC 230 may have a string DAC architecture. In some embodiments, the DAC 228 may have a lower resolution than the DAC 230. For example, the DAC 228 may have an 8-bit resolution and the DAC 230 may have a 12-bit resolution. In some embodiments, multiple similarly configured DACs 228, 230 may be employed. For example, multiple DACs 228 may be employed, such as 4 DACs 228 each having R2R DAC architecture and 8-bit resolution. For another example, multiple DACs 230 may be employed, such as 4 DACs 230 each having string DAC architecture and a 12-bit resolution. The DACs 228, 230 may receive a digital signal and convert the digital signals to analog signal, such as voltages. The DACs 228, 230 may receive digital signals and output analog signals at voltage levels supported by the resolution of the DACs 228, 230. For example, the DACs 228 may receive digital signals and output analog voltages (e.g., $dac8_{[3:0]}$) at $2^8$ voltage levels, and the DACs 320 may receive digital signals and output analog voltages (e.g., $dac12_{[3:0]}$) at $2^{12}$ voltage levels.

The radiation hardened low-power data acquisition SOC 102 may be fabricated as a single radiation hardened semiconductor die 232. For example, the semiconductor material of the radiation hardened semiconductor die 232, may be silicon. In some embodiments, the semiconductor material of the radiation hardened semiconductor die 232 may be fabricated using processes for fabricating MOSFETs. For example, the semiconductor material of the radiation hardened semiconductor die 232 may be fabricated using processes for fabricating 0.25 μm CMOS. The components of the radiation hardened low-power data acquisition SOC 102 may be electrically coupled to, such as being integrated on, the semiconductor die 232. The components of the radiation hardened low-power data acquisition SOC 102 may be radiation hardened as well. For example, the radiation hardened semiconductor die 232 and/or the components of the radiation hardened low-power data acquisition SOC 102 may be configured to withstand absorption of at least approximately 300 krad. For another example, the radiation hardened semiconductor die 232 and/or the components of the radiation hardened low-power data acquisition SOC 102 may be configured to withstand absorption of at least approximately 1 Mrad. For another example, the radiation hardened semiconductor die 232 and/or the components of the radiation hardened low-power data acquisition SOC 102 may be configured to withstand absorption of at least approximately 3 Mrad. In some embodiments, the radiation hardened semiconductor die 232 may be electrically coupled to a power source (e.g., AVdd) and a ground (e.g., AVss).

The illustration in FIG. 2 and the components thereof are used as an example for ease of explanation. The illustration in FIG. 2 and the accompanying descriptions do not limit the scope of the claims or the descriptions herein. One of ordinary skill in the art will recognize that any number and combination of the components may be combined, separated, rearranged, omitted, etc., and that additional components, such as additional ones of the foregoing components and/or other common components of a computing device, may be included in any configuration.

Figure 3:
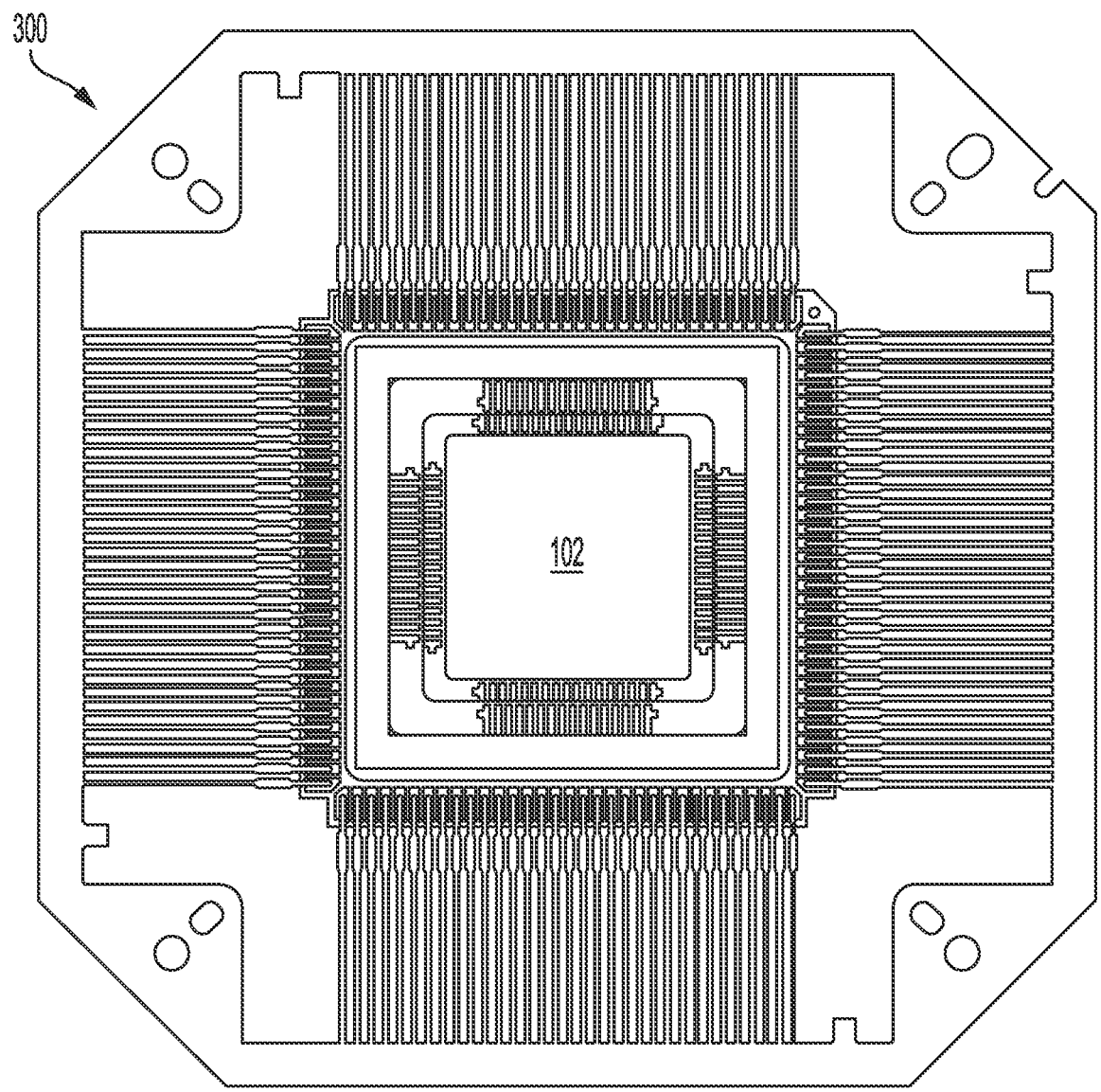
FIG. 3 is a component diagram of a radiation hardened low-power data acquisition SOC package incorporating a radiation hardened low-power data acquisition SOC illustrated in FIGS. 1 and 2 according to an embodiment.

FIG. 3 is a component diagram of a radiation hardened low-power data acquisition SOC package 300 incorporating a radiation hardened low-power data acquisition SOC 102 illustrated in FIGS. 1 and 2 according to an embodiment. With reference to FIGS. 1-3 the radiation hardened low-power data acquisition SOC package 300 may be a 132-lead flatpack. The leads may be electrically coupled to the various input and/or output leads of the radiation hardened low-power data acquisition SOC 102. For example, the leads may be electrically coupled to input and/or output leads configured for receiving analog signals, receiving digital conversion control signals, and/or receiving amplifier signals at the radiation hardened low-power data acquisition SOC 102, and/or outputting digital signals from the radiation hardened low-power data acquisition SOC 102. For another example, the leads may be electrically coupled to input and/or output leads configured for: receiving analog signals (e.g., ain0-ain15, aip0-aip15); receiving bias current generating circuit control voltages (e.g., Vb_sb); receiving voltage adjusting signals (e.g., Vadj_sb); receiving voltages (e.g., Vain, Viap) for combining with the output of the ground sensing level shifter 204 (in FIG. 2); outputting combined analog signals (e.g., Viao); receiving input voltages (e.g., Vrp, Vrn) of the inverting operational amplifier 214 (in FIG. 2), outputting amplified voltages (e.g., Vro); receiving voltage references (e.g., $Vbg_{2:0}$), receiving and/or and outputting a power supply (e.g., DVdd), communication protocol signals (e.g., I²C/SPI), reset signals (e.g., rst_n), clock signals (e.g., clk), multiple GPIO signals (e.g., $gpio_{[63:0]}$), serial communication mode signals (e.g., mode), and/or a ground signals (e.g., DVss); receiving reference voltages (e.g., Vrt); receiving analog voltages (e.g., Vadc12, Vadc16); outputting analog voltages (e.g., $dac8_{[3:0]}$, $dac12_{[3:0]}$); receiving a power supply (e.g., AVdd); and/or receiving a ground signal and/or outputting signals to a ground (e.g., AVss).

In some embodiments, a casing of the radiation hardened low-power data acquisition SOC package 300 may be made of various materials, such as opaque 90% minimum alumina ceramic. In some embodiments, the leads may be made of various materials, such as Kovar®. In some embodiments, exposed metal portions of the radiation hardened low-power data acquisition SOC package 300 may be coated by various materials, such as gold plated approximately 100 microns to approximately 225 microns thick over an electroplated nickel undercoating approximately 100 microns to approximately 350 microns thick. In some embodiments, a seal ring and a die-attached pad of the radiation hardened low-power data acquisition SOC package 300 may be electrically isolated. In some embodiments signal bondfingers of the radiation hardened low-power data acquisition SOC package 300 may electrically couple the leads to the inputs and/or outputs of the radiation hardened low-power data acquisition SOC 102, and a maximum inductance of approximately 11 nH and a maximum resistance of approximately 800 mΩ may exist from a signal bondfingers and a lead at a braze pad of the radiation hardened low-power data acquisition SOC package 300. In some embodiments, a maximum inductance of approximately 9 nH and a maximum resistance of approximately 400 mΩ may exist for VDD and VSS bondfingers at the respective braze pads.

FIG. 3 further illustrates example measurements for the radiation hardened low-power data acquisition SOC package 300. The illustration in FIG. 3 and the components thereof are used as an example for ease of explanation. The illustration in FIG. 3 and the accompanying descriptions do not limit the scope of the claims or the descriptions herein. One of ordinary skill in the art will recognize that the numbers, compositions, tolerances, and/or measurements of the components of the radiation hardened low-power data acquisition SOC package 300 may be varied.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein. The foregoing method descriptions and the process flow diagrams are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

What is claimed is:

1. A radiation hardened low-power data acquisition system-on-chip (SOC), comprising:
   a radiation hardened semiconductor die;
   a first radiation hardened multiplexer integrated on the radiation hardened semiconductor die and configured to receive a first plurality of analog signals and selectively output a first analog signal of the first plurality of analog signals;
   at least one radiation hardened analog to digital converted (ADC) integrated on the radiation hardened semiconductor die and configured to convert the first analog signal to a digital signal;
   a radiation hardened serial communication interface integrated on the radiation hardened semiconductor die and configured to output the digital signal;
   a radiation hardened bias current generating circuit integrated on the radiation hardened semiconductor die, comprising:
      a bias amplifier configured to receive a voltage adjusting signal at a first input and a bias current generating circuit control voltage at a second input, and to output an amplified voltage; and
      a transistor configured to receive the voltage adjusting signal at a first node, to receive the amplified voltage from the bias amplifier at a gate node, and output a bias current at a second node in response to receiving the amplified voltage at the gate node, wherein the bias current is combined with the first analog signal.

2. The radiation hardened low-power data acquisition SOC of claim 1, further comprising a radiation hardened ground sensing level shifter integrated on the radiation hardened semiconductor die and configured to voltage level shift the first analog signal.

3. The radiation hardened low-power data acquisition SOC of claim 2, further comprising a first radiation hardened electric contactor integrated on the radiation hardened semiconductor die and configured to selectively electrically couple an output of the first radiation hardened multiplexer and an input of the radiation hardened ground sensing level shifter to a radiation hardened bias current generating circuit integrated on the radiation hardened semiconductor die,
   wherein electrically coupling the output of the first radiation hardened multiplexer and the input to the radiation hardened bias current generating circuit combines a bias current from the radiation hardened bias current generating circuit with the first analog signal producing a biased first analog signal, and
   wherein the radiation hardened ground sensing level shifter configured to voltage level shift the first analog signal is configured to voltage level shift the biased first analog signal.

4. The radiation hardened low-power data acquisition SOC of claim 3, further comprising:
   a second radiation hardened multiplexer integrated on the radiation hardened semiconductor die and configured to receive a second plurality of analog signals and selectively output a second analog signal of the second plurality of analog signals; and
   a second radiation hardened electric contactor integrated on the radiation hardened semiconductor die and configured to selectively electrically couple an output of the second radiation hardened multiplexer and the input of the radiation hardened ground sensing level shifter to the radiation hardened bias current generating circuit,
   wherein electrically coupling the output of the second radiation hardened multiplexer and the input to the radiation hardened bias current generating circuit combines the bias current from the radiation hardened bias current generating circuit with the second analog signal producing a biased second analog signal, and
   wherein the radiation hardened ground sensing level shifter is further configured to voltage level shift the biased second analog signal.

5. The radiation hardened low-power data acquisition SOC of claim 4, wherein the first radiation hardened multiplexer and the second radiation hardened multiplexer each comprise 16 inputs and one output.

6. The radiation hardened low-power data acquisition SOC of claim 1, further comprising a radiation hardened instrumentation amplifier configured to receive the first analog signal at a first input and a first voltage for combining with the first analog signal at a second input, and to output a first combined voltage.

7. The radiation hardened low-power data acquisition SOC of claim 6, further comprising:
   a second radiation hardened multiplexer integrated on the radiation hardened semiconductor die and configured to receive a second plurality of analog signals and selectively output a second analog signal of the second plurality of analog signals;
   a first radiation hardened electric contactor integrated on the radiation hardened semiconductor die and configured to selectively electrically couple an output of the first radiation hardened multiplexer to the first input of the radiation hardened instrumentation amplifier, wherein the radiation hardened instrumentation amplifier is configured to receive the first analog signal at the first input and the first voltage for combining with the first analog signal at the second input, and to output the first combined voltage in response to the first radiation hardened electric contactor selectively electrically coupling the output of the first radiation hardened multiplexer to the first input of the radiation hardened instrumentation amplifier; and
   a second radiation hardened electric contactor integrated on the radiation hardened semiconductor die and configured to selectively electrically couple an output of the second radiation hardened multiplexer to the second input of the radiation hardened instrumentation amplifier, wherein the radiation hardened instrumentation amplifier is further configured to receive the second analog signal at the second input and a second voltage for combining with the second analog signal at the second input, and to output a second combined voltage in response to the second radiation hardened electric contactor selectively electrically coupling the output of the second radiation hardened multiplexer to the second input of the radiation hardened amplifier.

8. The radiation hardened low-power data acquisition SOC of claim 1, wherein the radiation hardened serial communication interface supports SPI protocol.

9. The radiation hardened low-power data acquisition SOC of claim 1, wherein the radiation hardened serial communication interface comprises 64 GPIO leads.

10. The radiation hardened low-power data acquisition SOC of claim 1, wherein the first radiation hardened multiplexer is electrically connectable to an instrument or a sub-system of a spacecraft, wherein the first radiation hardened multiplexer is configured to receive the first plurality of analog signals from the instrument or the sub-system of the spacecraft.

11. The radiation hardened low-power data acquisition SOC of claim 1, wherein the first radiation hardened multiplexer is further configured to receive an analog to digital conversion control signal configured to cause the first radiation hardened multiplexer to selectively output the first analog signal.

12. The radiation hardened low-power data acquisition SOC of claim 1, wherein the radiation hardened low-power data acquisition SOC is configure to withstand absorption of any of the group of at least approximately 300 krad, at least approximately 1 Mrad, or at least approximately 3 Mrad.

13. The radiation hardened low-power data acquisition SOC of claim 1, further comprising:
   a first radiation hardened ADC integrated on the radiation hardened semiconductor die and configured with a 12-bit resolution and a 1000 kbps sampling rate; and
   a second radiation hardened ADC integrated on the radiation hardened semiconductor die and configured with a 16-bit resolution and a 4 kHz sampling rate,
   wherein the at least one radiation hardened ADC comprises one of the first radiation hardened ADC or the second radiation hardened ADC.

14. The radiation hardened low-power data acquisition SOC of claim 1, further comprising:
   a plurality of radiation hardened R2R digital to analog converters (DAC) integrated on the radiation hardened semiconductor die and configured with an 8-bit resolution; and
   a plurality of radiation hardened string DACs integrated on the radiation hardened semiconductor die and configured with a 12-bit resolution.

15. The radiation hardened low-power data acquisition SOC of claim 1, further comprising a radiation hardened inverting operational amplifier integrated on the radiation hardened semiconductor die, configured to receive a first input voltage at a first input, to receive a second input voltage at a second input, and to output an amplified voltage at an output, and having the second input electrically coupled to a radiation hardened grounded resistor and a radiation hardened resistor at a first end, and the output electrically coupled to the radiation hardened resistor at a second end.

16. The radiation hardened low-power data acquisition SOC of claim 1, further comprising a plurality of radiation hardened bandgap references integrated on the radiation hardened semiconductor die.

17. The radiation hardened low-power data acquisition SOC of claim 1, further comprising a radiation hardened low-power data acquisition SOC package having 132 leads.

* * * * *